(12) United States Patent
Kaluza et al.

(10) Patent No.: US 8,774,973 B2
(45) Date of Patent: Jul. 8, 2014

(54) DEVICE FOR CONTROLLING AN ELECTROMAGNETIC VALVE

(75) Inventors: Jan Kaluza, Boeblingen (DE); Horst Kleinknecht, Fichtenberg (DE)

(73) Assignee: Robert Bosch GmbH, Stuttgart (DE)

(*) Notice: Subject to any disclaimer, the term of this patent is extended or adjusted under 35 U.S.C. 154(b) by 586 days.

(21) Appl. No.: 12/518,822

(22) PCT Filed: Nov. 29, 2007

(86) PCT No.: PCT/EP2007/063027
§ 371 (c)(1),
(2), (4) Date: Nov. 30, 2009

(87) PCT Pub. No.: WO2008/071557
PCT Pub. Date: Jun. 19, 2008

(65) Prior Publication Data
US 2010/0106300 A1     Apr. 29, 2010

(30) Foreign Application Priority Data
Dec. 14, 2006  (DE) .......................... 10 2006 059 624

(51) Int. Cl.
*G05D 7/00*     (2006.01)
(52) U.S. Cl.
USPC ......................................... 700/282; 324/418
(58) Field of Classification Search
USPC ................... 700/282, 275; 701/103; 324/418; 60/286, 287
See application file for complete search history.

(56) References Cited

U.S. PATENT DOCUMENTS

| | | | |
|---|---|---|---|
| 4,401,010 A | 8/1983 | Eddington | |
| 4,896,101 A * | 1/1990 | Cobb | 324/73.1 |
| 6,313,617 B1 | 11/2001 | Engelmann et al. | |
| 6,394,414 B1 * | 5/2002 | Breitling et al. | 251/129.04 |
| 6,917,203 B1 * | 7/2005 | Perotti et al. | 324/418 |
| 2001/0048367 A1 | 12/2001 | Wimmer et al. | |
| 2004/0128033 A1 * | 7/2004 | Ku et al. | 700/282 |
| 2004/0160725 A1 | 8/2004 | Gu | |
| 2005/0128658 A1 * | 6/2005 | Frenz et al. | 361/18 |
| 2006/0196170 A1 * | 9/2006 | Henning et al. | 60/286 |

FOREIGN PATENT DOCUMENTS

| | | |
|---|---|---|
| EP | 1130300 A1 * | 9/2001 |
| JP | 9-246042 | 9/1997 |
| JP | 11-308107 | 11/1999 |
| JP | 11-351432 | 12/1999 |
| JP | 2001-280189 | 10/2001 |
| JP | 2002-231530 | 8/2002 |
| JP | 2003-536076 | 12/2003 |

OTHER PUBLICATIONS

International Search Report, PCT/EP2007/063027 dated Nov. 21, 2008.

* cited by examiner

*Primary Examiner* — Sean Shechtman
*Assistant Examiner* — Steven Garland
(74) *Attorney, Agent, or Firm* — Kenyon & Kenyon LLP

(57) ABSTRACT

In a device for controlling an electromagnetic valve, input device(s) write a multitude of measured values for the current and/or the voltage into a first memory to represent a characteristic. Analysis device(s) perform a state analysis and/or a change-over-time analysis. On the basis of the state analysis and/or the change-over-time analysis, evaluation device(s) correct at least one control variable, which characterizes the control, and write it into a second memory. Control device(s) control an output stage on the basis of the control variables.

17 Claims, 3 Drawing Sheets

US 8,774,973 B2

DEVICE FOR CONTROLLING AN ELECTROMAGNETIC VALVE

FIELD OF THE INVENTION

The present invention is directed to a method and a device for controlling an electromagnetic valve.

BACKGROUND INFORMATION

Electromagnetic valves are generally used for the dosing of fluids such as fuel, for example, and/or liquids that are used in connection with an exhaust-gas aftertreatment. Information as to whether the valve is overloaded, whether it blocks or whether the dosed quantity corresponds to the desired quantity is not fully available in the control device controlling the assigned internal combustion engine because this requires a considerable outlay in the control device. For instance, a current value or an evaluation is usually provided for each diagnosis, which as a rule is situated in the controller or in the control device in the form of a separate hardware component.

SUMMARY

A reliable operation and a diagnosis of an electromagnetic valve are possible when using the device according to example embodiments of the present invention. Due to the fact that input devices write a multitude of measured values for the current and/or the voltage into a first memory in order to represent a characteristic, and analysis devices perform a state analysis and/or a change-over-time analysis, and evaluation devices correct at least one control variable characterizing the control on the basis of the state analysis and/or the change-over-time analysis and write it into a second memory, and the control devices trigger an output stage on the basis of the control variables, it is possible to achieve a reliable operation and a diagnosis of the valve.

In example embodiments, the input devices have a digital/analog converter as well as a DMA. These offer the advantage of being available as inexpensive components and/or software.

It is especially advantageous if the analysis device and the evaluation device are included in a processor. Such processors are available at low cost. The analyzing device and the evaluation device are preferably realized as software, which is able to be developed and programmed cost-effectively. These elements may thus be adapted to other valves in an uncomplicated manner.

According to example embodiments of the present invention, the current characteristic or the voltage characteristic over the time or over the angular position of an engine shaft is read into a first memory. These data are processed by a processor. The processor modifies the control variables as a function of these data and writes them into a second memory.

It is especially advantageous if the input device, the processor and the control device are developed as elements of a controller.

The state analysis preferably ascertains variables such as a temperature variable, a hold current, and/or an offset current. These variables allow conclusions about the state. The risk of destruction of the valve or a possible defect of the valve is able to be detected in reliable manner on the basis of these variables.

The change-over-time analysis determines variables that characterize the opening or closing instant of the valve. Based on these variables, a diagnosis of the dosing operation is possible. For example, these variables constitute a measure for whether the fluid to be dosed was dosed at the correct time and in the correct amount.

It is especially advantageous if the input device(s) do not record the measured values across an entire dosing cycle but if the input device(s) read in the measured values in at least one measuring window. More specifically, it is provided to define a measuring window for each variable that is determined. In this way memory space can be saved or the measured values are able to be stored at shorter time intervals. This results in greater precision.

In this context it is especially advantageous if the beginning and the end of the measuring window are specified on the basis of an expected occurrence of an event.

Exemplary embodiments of the present invention are shown in the drawing and explained in greater detail in the following description.

DETAILED DESCRIPTION

Figure 1:
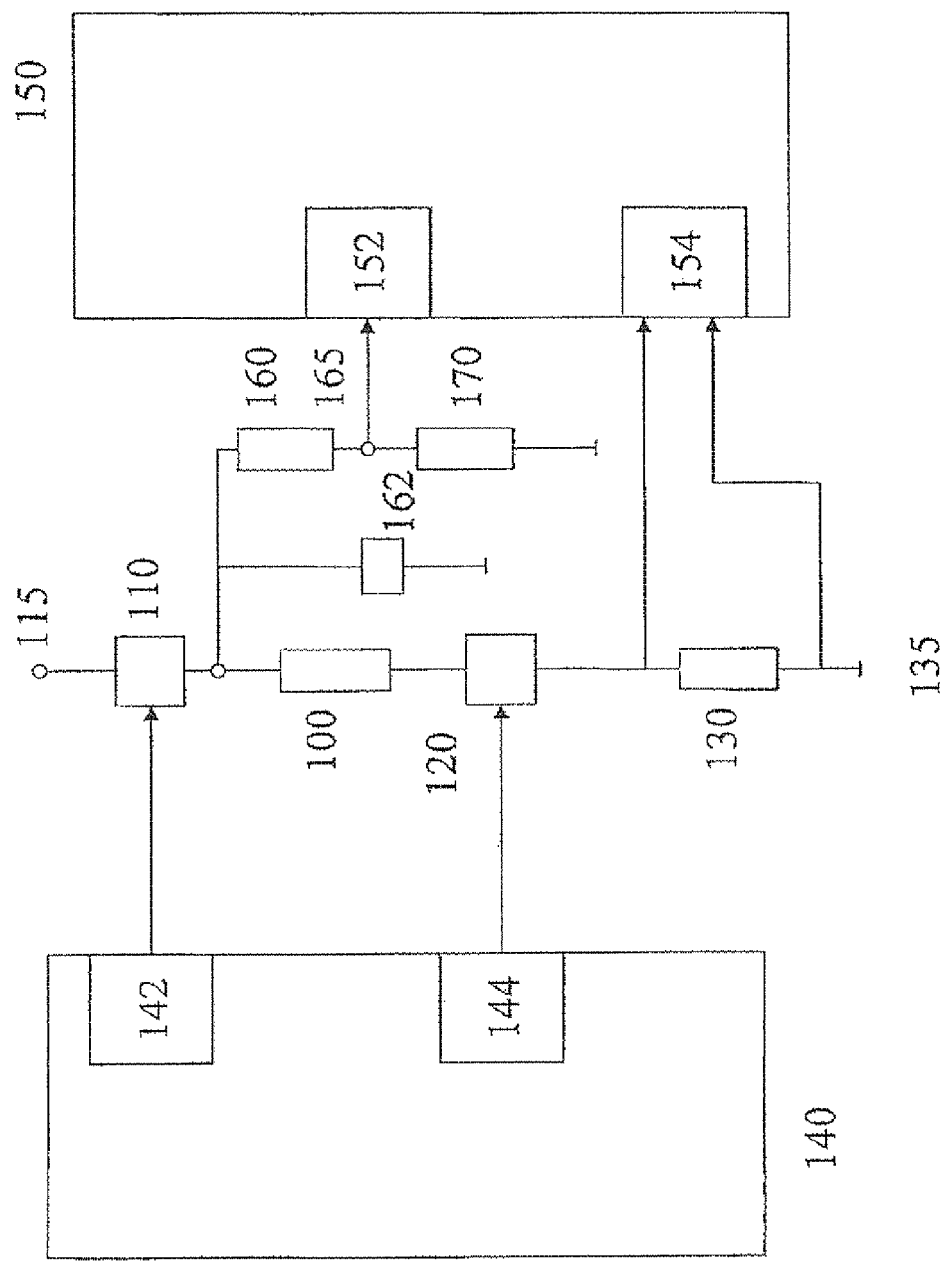
FIG. 1 is a block diagram of components of the device according to example embodiments of the present invention.

Components of a device for controlling an electromagnetic valve are illustrated in FIG. 1. The valve is identified by 100. Via a first switching device 110, which is also referred to as high-side switch, it is connected to a first terminal of a voltage supply 115. Via a second switching device 120, which is also referred to as low-side switch, and a current-measuring device 130 valve 100 is connected to a second terminal 135 of the voltage supply.

First switching device 110 is triggered by a current control 142, and the second switching device is triggered by a dosing control 144. Current control 142 and dosing control 144 are components of a control 140. In principle, it is also possible that the dosing control triggers first switching device 110, and that the current control triggers second switching device 120. In this case the placement of various additional elements, e.g., current measuring device 130 and freewheeling means and/or extinguishing device, must be modified as well.

A voltage divider, made up of a first resistor 160 and a second resistor 170, is connected to the second terminal of the supply voltage at a junction point between valve 100 and first switching device 110. Furthermore, this point is in connection with the second terminal of the supply voltage via a freewheeling diode 162. Junction point 165 applies a signal to a voltage detection 152.

In a simplified development, the voltage splitter is omitted and the voltage is tapped at terminal 115 of the voltage supply.

The two terminals of current-measuring device 130, which preferably is implemented as Ohmic resistor, reach a current detection 154. Voltage detection 152 and current detection 154 constitute components of an analysis 150.

In the illustrated exemplary embodiment, the valve is triggered via a high-side/low-side output stage. The energization of the first switching device is implemented in the sense of a current control and/or a current regulation. That is to say, the energization of first switching device 110 is selected such that a specified current is flowing through the valve. The regulation of the current through the valve is specified by, for example, a variable pulse-pause ratio of a pulse-width-modulated signal having a specific frequency.

In other words, current control 142 triggers the first switching means in such a way that the desired energization of the valve results. The energization is substantially defined by the current values in the individual phases, especially by the pick-up current between instants T2 and T3 and/or the hold current in the holding phase between instants T4 and T5. Furthermore, the energization is defined by the current rises and current drops in the other phases.

The second switching device is triggered by dosing control 144 in such a way that the dosing commences at a specific instant and ends at a specific instant, so that a specific quantity of fluid is dosed at a specific point in time. These instants and these time periods of the dosing are specified by a superposed control as a function of the operating state of the internal combustion engine or the state of an exhaust-gas aftertreatment system. The instants at which the energization commences and/or ends are essentially controlled by dosing control 144.

Figure 2:
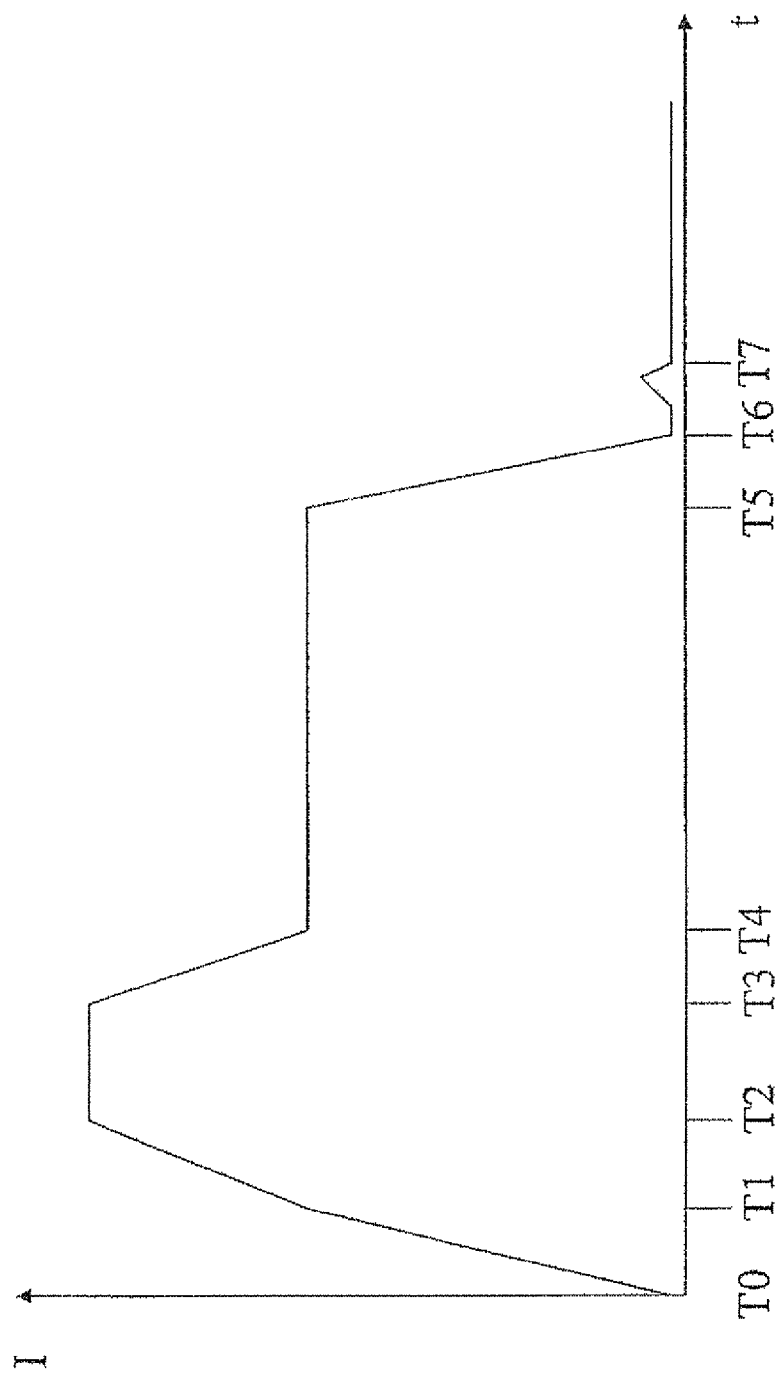
FIG. 2 illustrates the current flowing through the valve, plotted over the time.

Analysis circuit 150 detects and analyzes current I flowing through the valve, as well as voltage U applied at the valve. FIG. 2 illustrates the current characteristic of an energization during one dosing cycle, i.e., the dosing of fluid with the aid of the valve, by way of example. The supply of current to the valve commences at instant T0. That is to say, the high-side as well as the low-side switch are closed. The current rises up to instant T2. At instant T2, the current reaches a first current level, which is also referred to as pick-up current level. This current level is selected such that the valve reliably transitions into the new limit position. At instant T1, the valve attains its new limit position. This causes the inductivity of the valve to change, so that the current rise changes as well. On the basis of this change in the inductivity and the resulting change in the rise of the current at a constant voltage, this instant T1 is able to be detected by analyzing the current characteristic. Up to instant T3, the current is controlled by the first switching means in such a way that it remains at its trigger level.

Between instants T2 and T3, the coil is in its saturation. In this range, the coil temperature is preferably calculated on the basis of the flowing current and the applied voltage using Ohm's law. This requires knowledge both of the voltage that is applied at the coil and also the current that is flowing through the coil.

Between instant T3 and T4 the current drops to the hold current of the coil. This value is selected to be such that the valve remains in its position. This means that the valve is kept open, and the first switching device adjusts the current such that the current once again remains virtually constant. By lowering the current from the hold current, the power loss at the valve is reduced and the valve does not overheat.

The energization terminates at instant T5, i.e., both switching devices are opens, and the current drops to the zero value until instant T6. Due to the mechanical inertia, the valve needle still requires a certain amount of time until it attains its original position again. This instant, too, may be detected by analyzing the current characteristic. This estimation is performed in a similar manner as for the determination of the switching instant at instant T1. Following instant T7, the current usually assumes the value of zero or some other defined value. From that point in time, the offset values and the series of measurements may be adjusted. The metering cycle ends following instant T7.

Figure 3:
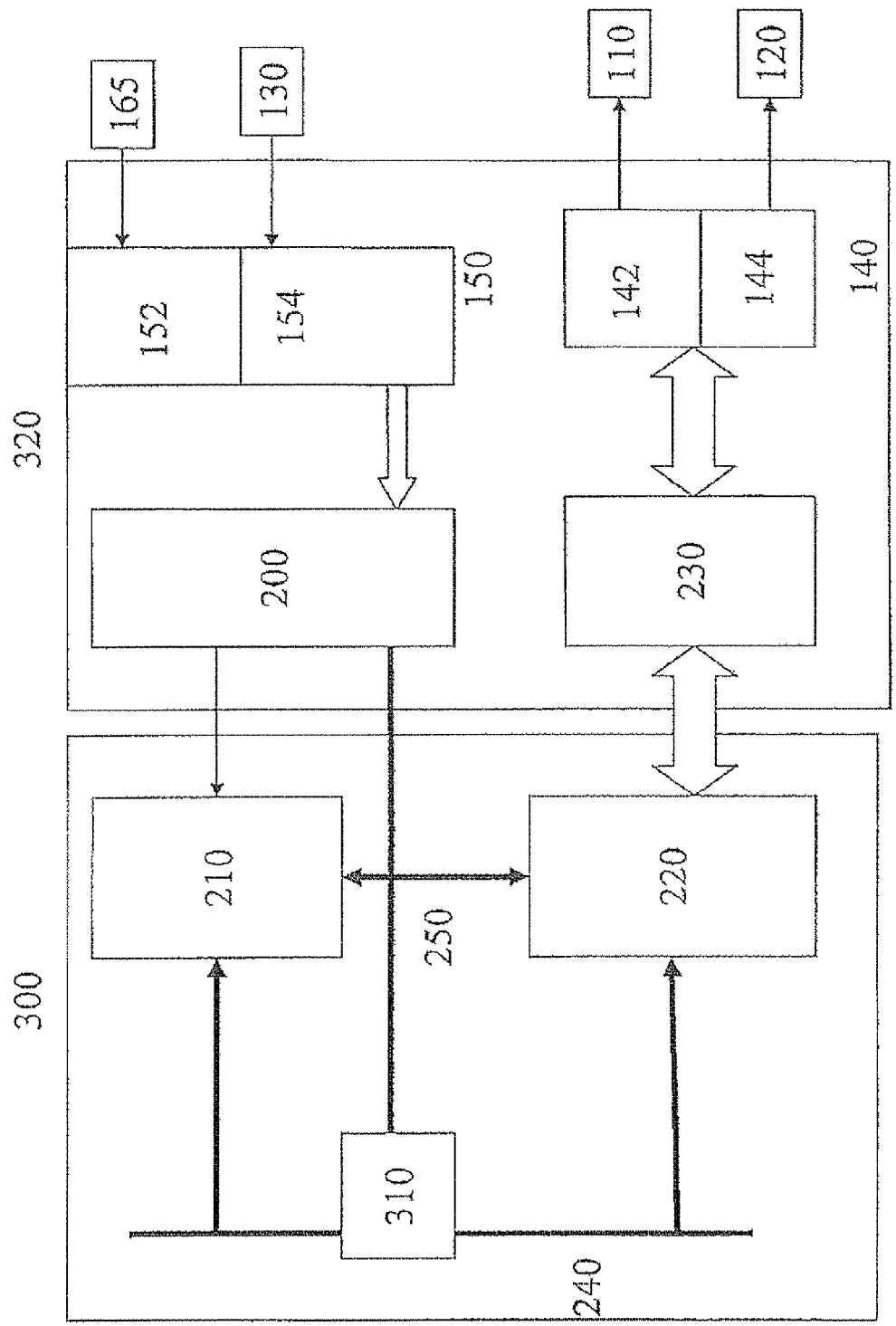
FIG. 3 is a detailed view of the device according to example embodiments of the present invention.

FIG. 3 shows the control unit for the valve, which includes control 140 and analysis 150, in greater detail. Elements already described in FIG. 1 are denoted by matching reference symbols. The shown control unit may be realized as hardware unit or as control method, which is processed by a processor, or as mixed form.

An example embodiment is described in the following text. The voltage applied at junction point 165 or the voltage applied at current-measuring means 130 arrives at voltage detection 152 or current detection 154, respectively. The current detection and the voltage detection are preferably realized as analog-to-digital converters, which convert the instantaneously applied signals into a digital signal that corresponds to the particular values of the voltage or current.

From a DMA 200, which may also be called a direct-memory access, the current values and/or the voltage values that had been detected by current detection 154 and/or voltage detection 152, respectively, are written into a memory 210. Preferably, it is provided that DMA 200 be realized as program structure.

Furthermore, it is preferably provided that first memory 210, the second memory and a computer 310, which processes the programs, are integrated in a processor 300.

For the exchange of data, first memory 210, DMA 200, a second memory 220, and the computer are interconnected via a data bus 250. First memory 210, second memory 220, and the computer are also connected to an address bus 240. Second memory 220 exchanges signals with a state machine 230. This state machine in turn applies corresponding signals to current control 142 and to dosing control 144.

The data stored in second memory 220 arrive via state machine 230 at control 140, which triggers switching means 110 and 120 correspondingly.

A/D converters 152, 154 and DMA 200 may also be called input means. State machine 230 and control 140 may also be called control means. DMA 200, state machine 230, analysis 150, and control 140 together form an interface. These elements are preferably part of a controller.

The incoming values with regard to voltage U applied at the valve, and/or current I flowing through the valve are converted in time-triggered manner from an analog signal into a digital signal by voltage detection 152 and current detection 154. The digitalization takes place with the aid of analog/digital converters, which form the essential elements of the current detection and the voltage detection. DMA 200 writes the digitized signals into first memory 210 at specific instants, i.e., in time-triggered manner. Thus, the signal characteristic of the voltage and/or the current over the time or over the angular position is stored in memory 210. In this context it may be provided that all values across the entire dosing cycle, i.e., from instant T0 to clearly past instant T7, are stored at fixed intervals.

One development defines only individual measuring windows within which the measured values are read into first memory 210. That means that the measured values are read in only in the ranges that are of interest and whose variation with time characterizes the injection process. To this end it is provided that, starting from the expected instant or the angular position at which the event is most likely to occur, the beginning and the end of the measuring window are defined. As a beginning, for example, an instant that precedes the expected instant by a fixed value may be defined as the beginning of the measuring window. An instant that lies after the beginning by a fixed time period is used as the end of the measuring window.

In a further development, it may also be provided that only one value or a plurality of values is/are stored for a specific period of time. It is sufficient, for example, if only one value is stored in the time period between T4 and T5. A plurality of values is stored in the time period between instant T0 and T2, so that instant T1 at which the inductivity of the coil changes is able to be detected reliably. Analogously, a plurality of values is also stored between instants T6 and T7 in order to detect the closing of the value by analyzing the current characteristic.

The system may be adapted to random consumers, current characteristics, voltage characteristics, and consequently applications by suitable design or programming of DMA 200. That means that a very flexible system is obtained, which therefore is also able to be used in a cost-effective manner.

Starting with these current values stored in first memory 210, computer 310 of processor 300 calculates different characteristic quantities that characterize the dosing of fluids with the aid of the solenoid valve. This means that the processor includes an analysis device, which performs a state analysis and/or a change-over-time analysis based on the characteristic for the current and/or the voltage stored in first memory 210.

The change-over-time analysis, for example, determines the instant from which point on the valve allows the fluid to flow or from which point on it prevents the fluid from flowing. These instants are also referred to as opening instant BIP or closing instant or EIP. In addition to these instants, additional instants that are characteristic of the injection process may be determined from the current and/or the voltage characteristic.

The state analysis determines the resistance of the coil, for example. This merely requires that a current/voltage value is read in at the proper time. The temperature of the coil as temperature variable is preferably determined from the resistance. In addition, various current values and/or voltage values may be detected in order to check the proper functioning of the valve. Such an additional value is what is termed the offset voltage and/or an offset current, which are read in at the end or shortly prior to the dosing cycle. Furthermore, the value of the hold current may be read in as additional variable.

Based on these variables and additional variables, which are not explained in greater detail here, computer 310 of processor 300 calculates variables that characterize the dosing. The processor includes evaluation means for this purpose. They evaluate the results of the change-over-time analysis and/or the state analysis. If the ascertained values deviate from the specified values, then the processor corrects at least one of the control variables that characterize the control.

The analysis device, which perform the state analysis, the evaluation means, which correct at least one control variable on the basis of the state analysis and/or the change-over-time analysis, are preferably realized as program of computer 310 or processor 300.

In the example illustrated in FIG. 2 having a high side and a low side switch, it is provided that one of the two switches is closed at the beginning of the dosing cycle, i.e., at instant T0, and opened again at instant T5. At instant T0, the second switch is closed for a specific period of time, preferably until instant T3, and then is triggered by a pulse-width-modulated signal, which is defined by its pulse duty factor and its frequency. From instant T6 until instant T7, the first switch is closed briefly so that the closing instant is able to be detected. The processor specifies as control variables the instants at which the energization is to start and end, as well as the pulse duty factor. Instead of the end, it is also possible to specify the duration as control variable as an alternative. These variables characterizing the dosing are stored by the processor in second memory 220.

On the basis of these values stored in the second memory, state machine 230 calculates control variables for application to switching means 110 and 120. This is implemented such, for example, that, based on the content of second memory 220, the state machine transmits to control 140 a characteristic over the time or the angular position of the state of the two switching devices. Control 140 then applies corresponding control signals to switching means 110 and 120. This state machine 230 and the control are also referred to as control means and are included in the controller in an example embodiment.

According to example embodiments of the present invention, the following procedure is provided. The output stage, made up of at least one switching device, is triggered by a processor via an interface 320. In the example embodiment described, two switching device are shown, but it is also possible to provide only one switching device or else additional switching device as well. The interface includes at least one analog/digital converter as well as the DMA (direct memory access). This interface detects 320 the voltage and/or the current and writes the change-over-time of the voltage and/or the current into the first memory of the processor. Based on a desired control characteristic for the valve stored in the second memory of the processor, the interface generates control signals for the switching device. The processor evaluates the signals independently of the type of output stage, and calculates the desired control characteristic. The interface adapts the values that the processor supplies or requires to the signals that the output stage requires or provides.

This means that the processor is completely independent of the utilized output stage or the utilized coil. The same also applies in reverse. Any consumer is able to be controlled in any desired manner with the aid of the processor. The adaptation of the consumer to the processor and vice versa takes place via the interface. This interface must be adapted to both. The interface includes only analog/digital converters and a small computing unit, which assumes the function of the DMA or the state machine.

Valves are frequently used for dosing fluid media in internal combustion engines. Since these valves are often installed near the engine or in close proximity to hot components such as the exhaust-gas tract, the thermal stressing of these components is very high. This thermal stressing, for one, is due to the heating by the internal combustion engine or elements assigned to it such as the exhaust-gas system, or by self-heating due to the energization of the valve in its coil. The heating not only causes a change in the internal resistance of the coil but can also cause damage or even the destruction of the coil in the extreme case. The change in the internal resistance of the coil also changes the dynamic behavior of the valve, which in turn affects the dosing of the fluid.

To prevent this, it is provided to detect the temperature of the valve and to implement the control or the energization of the valve as a function of the temperature of the valve. In the static state, i.e., in particular between instants T2 and T3, the current is measured during the energization. The voltage applied at the valve is known in this state or is likewise measured. The internal resistance of the coil is then determined on the basis of the current and the voltage. Based on the internal resistance and the known internal resistance at room temperature, the temperature of the coil is ascertained. To this end, a characteristics map, for instance, may be provided in which the coil temperature is stored as a function of the internal resistance. As an alternative, it may be provided to calculate the temperature on the basis of the acquired variables. The control strategy of the valve is then modified on the basis of this stored temperature or by using the determined internal resistance directly. For one, the control strategy is modified in the sense of influencing the temperature, and for another, it is provided that the control is modified such that the influences of the temperature on the behavior of the valve are compensated.

To control the temperature, it may be provided, for instance, that the energization takes place in temperature-optimized fashion. This is possible, for example, by selecting a smaller voltage or a smaller current rise in the pick-up phase, i.e., until instant T3. In this manner, the temperature stressing of the valve is reduced, while the opening of the solenoid valve slows in return. The temperature is influenced by modifying individual or several variables that determine the energization.

The modified dynamic behavior of the valve due to the higher temperature is compensated for by shortening and/or extending the control. Furthermore, it is provided also to compensate the influences on the dynamic behavior that are attributable to the temperature-optimized energization of the valve, likewise by modifying the control. Once again, this is achieved by extending and/or shortening the control time correspondingly.

According to example embodiments of the present invention, the energization in temperature-optimized manner is implemented in certain operating states, which means that the energization is implemented such that the heat loss is kept as low as possible. In particular, it is provided that such a temperature-optimized energization takes place as soon as it becomes obvious that the temperature is greater than a threshold value or that the internal resistance of the coil exceeds a specific value. This is especially advantageous because a temperature-optimized energization usually causes a change in the switching times of the valve or in other variables that affect the dosed quantity, or it makes the control less precise. Therefore, this temperature-optimized energization is preferably implemented only when it becomes necessary.

Furthermore, it is especially advantageous that characteristic instants and current values during the energization are detected and taken into account in the control. Detected are, for instance, the instant at which the valve opens and/or the instant at which the valve closes. These two instants essentially determine the dosed fluid quantity. By detecting these instants, the actually dosed quantity is able to be ascertained. If the quantity or these characteristic values deviate(s) from specified values, then a correction of the control takes place, which means that dosing control 144 makes corresponding corrections, i.e., the dosing is extended, shortened and/or shifted by a particular amount. Because of this measure, for one, changes in the valve that are caused by the higher temperature or by a temperature-optimized energization are determined and corrected. This means that, based on the values for the current and/or the voltage, the instants at which the valve opens and/or closes are determined. These instants are then used to correct the control.

Over all, this means that the temperature is determined in particular by analyzing the current and the voltage that flows through the valve or is applied at the valve, and by taking it into account in the control. To this end, for one, the dosing is modified in order to correct influences. This is preferably accomplished by dosing control 144 and by the controlling of second switching device 120. Furthermore, a temperature-optimized energization as a function of the temperature takes place. This is preferably achieved by appropriate control via current control 142, by controlling first switching device 120.

What is claimed is:

1. A device for controlling an electromagnetic valve, comprising:
    an input device adapted to write a multitude of measured values for at least one of (a) a current and (b) a voltage into a first memory to represent a characteristic;
    an analysis device adapted to perform (a) a state analysis and (b) a change-over-time analysis; and
    an evaluation device adapted to correct at least one control variable characterizing a control on the basis of (a) the state analysis via a state machine calculation and (b) the change-over-time analysis, and write values of the at least one control variable into a second memory; and
    a control device adapted to an output stage on the basis of the at least one control variable, wherein the control device is adapted to control the electromagnetic valve to dose fluid used in connection with an exhaust-gas aftertreatment in an internal combustion engine based on the corrected at least one control variable.

2. The device according to claim 1, wherein the input device includes a analog/digital converter and a direct memory access (DMA) device.

3. The device according to claim 1, wherein the analysis device and the evaluation device are included in a processor.

4. The device according to claim 1, wherein the input device, and the control device are included in a controller.

5. The device according to claim 1, wherein the state analysis is adapted to determines at least one of (a) a temperature variable, (b) a hold current, and (c) an offset current.

6. The device according to claim 1, wherein the change-over-time analysis is adapted to determine variables that determine at least one of (a) an opening and (b) a closing instant of the valve.

7. The device according to claim 1, wherein the input device is adapted to read in measured values in at least one measuring window.

8. The device according to claim 7, wherein a beginning and an end of the measuring window are specified on the basis of an expected occurrence of an event.

9. The device according to claim 1, wherein the input device includes a analog/digital converter and a direct memory access (DMA) device, wherein the analysis device and the evaluation device are included in a processor.

10. The device according to claim 9, wherein the input device, and the control device are included in a controller.

11. The device according to claim 9, wherein the state analysis is adapted to determines at least one of (a) a temperature variable, (b) a hold current, and (c) an offset current.

12. The device according to claim 9, wherein the change-over-time analysis is adapted to determine variables that determine at least one of (a) an opening and (b) a closing instant of the valve.

13. The device according to claim 9, wherein the input device is adapted to read in measured values in at least one measuring window, and wherein a beginning and an end of the measuring window are specified on the basis of an expected occurrence of an event.

14. The device according to claim 9, wherein the input device, and the control device are included in a controller, and wherein the state analysis is adapted to determines at least one of (a) a temperature variable, (b) a hold current, and (c) an offset current.

15. The device according to claim 14, wherein the change-over-time analysis is adapted to determine variables that determine at least one of (a) an opening and (b) a closing instant of the valve.

16. The device according to claim 15, wherein the input device is adapted to read in measured values in at least one measuring window, and wherein a beginning and an end of the measuring window are specified on the basis of an expected occurrence of an event.

17. The device according to claim 14, wherein the input device is adapted to read in measured values in at least one measuring window, and wherein a beginning and an end of the measuring window are specified on the basis of an expected occurrence of an event.

* * * * *